United States Patent
Lee et al.

(10) Patent No.: US 12,362,017 B2
(45) Date of Patent: *Jul. 15, 2025

(54) MEMORY DEVICE WITH REDUCED AREA

(71) Applicant: Taiwan Semiconductor Manufacturing Company, Ltd., Hsinchu (TW)

(72) Inventors: Chun-Ying Lee, Hsinchu (TW); Chia-En Huang, Xinfeng Township (TW); Chieh Lee, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/632,856

(22) Filed: Apr. 11, 2024

(65) Prior Publication Data
US 2024/0257877 A1    Aug. 1, 2024

Related U.S. Application Data

(63) Continuation of application No. 17/752,662, filed on May 24, 2022, now Pat. No. 11,984,165.

(51) Int. Cl.
*G11C 16/08* (2006.01)
*G11C 16/04* (2006.01)
(Continued)

(52) U.S. Cl.
CPC .......... *G11C 16/08* (2013.01); *G11C 16/0483* (2013.01); *H10B 41/20* (2023.02); *H10B 43/20* (2023.02)

(58) Field of Classification Search
CPC .... G11C 16/08; G11C 16/0483; H10B 41/20; H10B 43/20
(Continued)

(56) References Cited

U.S. PATENT DOCUMENTS 6,304,508 B1    10/2001    Uehara et al.
6,335,893 B1    1/2002    Tanaka et al.
(Continued)

FOREIGN PATENT DOCUMENTS

CN        112309953 A    *    2/2021    ....... H01L 21/76224
CN        113748463              12/2021
(Continued)

OTHER PUBLICATIONS

Non-Final Office Action on U.S. Appl. No. 17/752,662 DTD Nov. 9, 2023.
(Continued)

*Primary Examiner* — Michael T Tran
(74) *Attorney, Agent, or Firm* — FOLEY & LARDNER LLP

(57) ABSTRACT

A memory device includes a plurality of word lines (WLs) above a substrate; a plurality of memory strings laterally isolated from each other, each of the plurality of memory strings being operatively coupled to a respective subset of the plurality of WLs; and a plurality of drivers, each of the plurality of drivers being configured to control a corresponding one of the plurality of WLs and including a first transistor having a first conductive type and a second transistor having a second conductive type opposite to the first conductive type.

20 Claims, 12 Drawing Sheets

(51) Int. Cl.
*H10B 41/20* (2023.01)
*H10B 43/20* (2023.01)

(58) Field of Classification Search
USPC ..................................... 365/185.23, 185.25
See application file for complete search history.

(56) References Cited

U.S. PATENT DOCUMENTS

| | | | |
|---|---|---|---|
| 9,015,561 B1* | 4/2015 | Hu | G11C 29/76 |
| | | | 714/773 |
| 9,105,468 B2 | 8/2015 | Rabkin et al. | |
| 10,727,276 B1* | 7/2020 | Lien | H10N 70/24 |
| 10,811,431 B1* | 10/2020 | Makala | H10B 51/20 |
| 10,868,042 B1* | 12/2020 | Zhang | H10D 64/033 |
| 11,062,759 B1* | 7/2021 | Ku | G11C 16/3427 |
| 11,114,178 B1* | 9/2021 | Eliash | G11C 16/10 |
| 11,744,080 B2 | 8/2023 | Lin et al. | |
| 2006/0055045 A1 | 3/2006 | Park et al. | |
| 2007/0145459 A1 | 6/2007 | Park et al. | |
| 2008/0232183 A1 | 9/2008 | Maejima et al. | |
| 2010/0265765 A1 | 10/2010 | Seo et al. | |
| 2012/0268978 A1 | 10/2012 | Shibata | |
| 2015/0069320 A1 | 3/2015 | Rabkin et al. | |
| 2015/0115350 A1 | 4/2015 | Maejima | |
| 2015/0131381 A1* | 5/2015 | Rhie | H10B 41/27 |
| | | | 257/314 |
| 2017/0040336 A1* | 2/2017 | Lee | H10D 1/00 |
| 2017/0077230 A1 | 3/2017 | Ikeda et al. | |
| 2017/0098474 A1 | 4/2017 | Tran et al. | |
| 2017/0229306 A1 | 8/2017 | Luan et al. | |
| 2018/0204619 A1 | 7/2018 | Futatsuyama et al. | |
| 2018/0268877 A1 | 9/2018 | Sato | |
| 2018/0358102 A1 | 12/2018 | Zhang et al. | |
| 2020/0185039 A1 | 6/2020 | Chibvongodze et al. | |
| 2020/0185392 A1 | 6/2020 | Makosiej et al. | |
| 2020/0350371 A1 | 11/2020 | Pellizzer et al. | |
| 2021/0065799 A1 | 3/2021 | Kim et al. | |
| 2021/0066316 A1 | 3/2021 | Ota et al. | |
| 2021/0082879 A1 | 3/2021 | Sanuki et al. | |
| 2021/0082916 A1 | 3/2021 | Inden | |
| 2021/0233900 A1* | 7/2021 | Kim | H01L 25/50 |
| 2021/0295922 A1* | 9/2021 | Huang | G11C 16/24 |
| 2021/0366923 A1 | 11/2021 | Oh | |
| 2021/0373993 A1* | 12/2021 | Sharon | G11C 16/0483 |
| 2022/0085020 A1 | 3/2022 | Nagatsuka et al. | |
| 2022/0115322 A1 | 4/2022 | Zhang et al. | |
| 2022/0139878 A1 | 5/2022 | Ogawa et al. | |
| 2022/0180920 A1 | 6/2022 | Saito et al. | |

FOREIGN PATENT DOCUMENTS

| | | | | |
|---|---|---|---|---|
| FR | 3021806 A1 | | 12/2015 | |
| JP | H11-234109 A | | 8/1999 | |
| TW | 303515 A | | 4/1997 | |
| TW | 202111955 A | * | 3/2021 | ............ G11C 5/025 |
| TW | 202218127 A | | 5/2022 | |
| WO | WO-2021/069998 A1 | | 4/2021 | |
| WO | WO-2021/186199 A1 | | 9/2021 | |

OTHER PUBLICATIONS

Notice of Allowance on U.S. Appl. No. 17/752,662 DTD Jan. 23, 2024.

Office Action issued in connection with Taiwan Appl. No. 112103540 dated Dec. 7, 2023.

* cited by examiner

MEMORY DEVICE WITH REDUCED AREA

CROSS-REFERENCE TO RELATED APPLICATION

This application is a continuation of U.S. patent application Ser. No. 17/752,662, filed May 24, 2022, titled "MEMORY DEVICE WITH REDUCED AREA," the entire contents of which are incorporated herein by reference for all purposes.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 4 illustrates an example layout of the WL drivers of the memory device of FIG. 1, in accordance with some embodiments.

DETAILED DESCRIPTION

Figure 1:
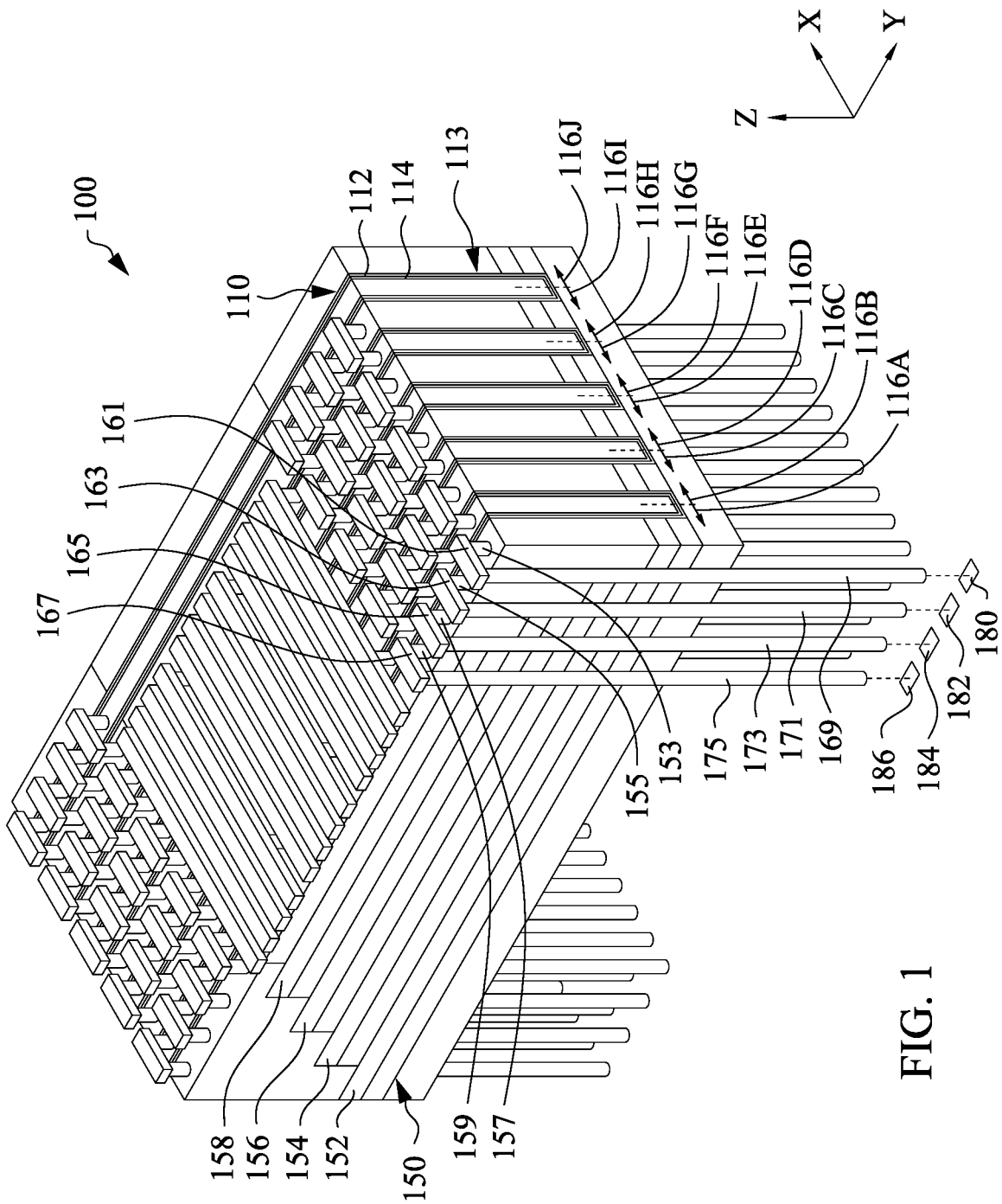
FIG. 1 illustrates a perspective view of a memory device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over, or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" "top," "bottom" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The large-scale integration and planar scaling of individual chips is reaching an expensive limit. If individual chips now, and later memory blocks, memory macros, and processing cores, can be tightly linked in optimally designed and processed small footprint vertical stacks, then performance can be increased, power reduced and cost contained. An example of such vertically stack devices include a three-dimensional (3D) memory device.

In general, 3D memory devices include an array of memory cells formed in a stack of insulating layers and gate layers. The memory cells are formed across multiple memory layers (levels, or otherwise tiers) over a substrate. For example, each memory cell can be constituted by: a portion of a semiconductor layer continuously extending along a vertical direction of the array, a portion of a memory film continuously extending along the vertical direction, a first conductive structure continuously extending along the vertical direction (which functions as a drain electrode), a second conductive structure continuously extending along the vertical direction (which functions as a source electrode), and one of a number of third conductive structures continuously extending along a first lateral direction of the array (which functions as a gate electrode). The drain electrode, source electrode, and gate electrode may be operatively coupled to or function as a "bit line (BL)," a "source/select line (SL), and a "word line (WL)," respectively, of the memory cell.

To further increase the density of the memory cells, the WLs are typically formed with a staircase profile. In short, a first subset of the WLs, disposed in different memory levels, extend along the first lateral direction with respective lengths. For example, the WL disposed in a lower memory level extends with a longer length than the WL disposed in an upper memory level. Further, in each memory level, a second subset of the WLs, having the same extending length in the first lateral direction, are spaced apart from one another along a second lateral direction perpendicular to the first lateral direction.

When operating such a memory array, various signals are applied to the memory cells through their corresponding BLs, SLs, and WLs. For example, to access one of the memory cells, a WL driver can apply an assertion signal to a corresponding WL of the selected memory cell, thereby allowing access of the memory cell. Each WL is typically coupled to a respective WL driver. Such a WL driver is formed over a major surface of the substrate as a number of operatively coupled transistors. Further, these transistors can be grouped into two conductive types, e.g., an n-type transistor (sometimes referred to as an "NMOS") and a p-type transistor (sometimes referred to as a "PMOS"). To form such two different conductive types of transistors, a first well having a first conductive type (e.g., a p-type well (p-well)) and a second well having a second conductive type (e.g., an n-type well (n-well)) are typically formed along the major surface of the substrate to house the NMOS and PMOS, respectively.

In existing technologies, the corresponding p-well and n-well are typically positioned immediately next to each other. In compliance with various design rules, such closely arranged p-well and n-well are required to separate from each other with a minimum spacing. With this minimum spacing, a total area for forming the WL drivers of all the memory cells of the array can quickly rack up, which can disadvantageously limit the scaling of the 3D memory device. Further, with opposite conductive types of wells disposed next to each other, each of the wells is formed with a relatively narrow width (e.g., in a direction along which the p-well and n-well are arranged with respect to each other). As a result, a well resistance of each of the wells is increased accordingly, which can potentially increase the likelihood of occurrence of latch up issues in the formed WL driver. Thus, the existing 3D memory devices have not been entirely satisfactory in some aspects.

Embodiments of the present disclosure are discussed in the context of forming a semiconductor device, and particularly in the context of forming a 3D memory device, that has a reduced area and is more immune from the latch up issues. For example, the 3D memory device, as disclosed herein, includes a number of WLs, and a number of WL drivers. Each of the WLs is operatively coupled to a corresponding one of the WL drivers. The WL driver includes at least a first transistor with a first conductive type and a second transistor with a second conductive type. In various embodiments, such two transistors, with opposite conductive types, are disposed in two wells in a substrate, respectively, and these two wells are spaced apart from one another. For example, these two wells may be located on the opposite sides of a corresponding memory array along a lengthwise direction of the number of WLs. As such, the transistors having the same conductive type of the WL drivers can be arranged in the same well. For example, all n-type transistors (NMOS's) of respectively different WL drivers coupled to neighboring WLs (e.g., disposed in the same memory layer) can be disposed immediately next to each other; and all p-type transistors (PMOS's) of respectively different WL drivers coupled to neighboring WLs (e.g., disposed in the same memory layer) can be disposed immediately next to each other. Consequently, a total area of the transistors forming the WL drivers of the disclosed 3D memory device can be significantly reduced (e.g., by eliminating the above-discussed minimum spacing between different conductive types of wells). In addition, with the same conductive types of transistors disposed in the same (e.g., vast) well, a corresponding width of the well can be advantageously increased, which can significantly suppress the latch up issues.

FIG. 1 illustrates a perspective view of a memory device 100, as herein disclosed, in accordance with various embodiments. For example, the memory device 100 is implemented as a 3D memory device in which a number of memory cells are vertically stacked with each other. It should be understood that the memory device 100 is merely illustrated as an example. Thus, the memory device 100 can include any of various other structures/features, while remaining within the scope of the present disclosure.

The memory device 100 includes a memory array portion 110 and an interface portion 150. In various embodiments, the memory array portion 110 includes a number of memory strings laterally spaced from one another, and each of the memory strings include a number of memory cells vertically spaced from one another. Such vertically memory cells of any of the memory strings are disposed in a number of memory levels (or layers), respectively. In various embodiments, the interface portion 150 is electrically or otherwise operatively coupled to the interface portion 150. The interface portion 150 includes a number of access lines (e.g., word lines (WLs)) each formed as a laterally extending conductive structure. The memory cells of each memory string are coupled to a respective subset of such WLs that are disposed in different memory levels, respectively. Further, the WLs of each subset extend along the lateral direction with respectively different lengths. As such, the WLs can form a staircase profile, in accordance with various embodiments.

For example in FIG. 1, the memory array portion 110 includes a number of memory layers 112 vertically (e.g., along the Z direction) and laterally (e.g., along the Y direction) extending a trench 113 partially with a dielectric material. The memory array portion 110 further includes a number of semiconductor layers 114, each of which extends along the sidewall of a portion of a corresponding one of the memory layers 112. The interface portion 150 includes a number of WLs 152, 154, 156, and 158 that are vertically spaced from one another and laterally extend (e.g., along the Y direction) with respective different lengths. Alternatively stated, these WLs 152 to 158 with different lengthwise lengths are disposed in different memory layers, respectively. For instance, the WL 152 with a longest length is disposed in a bottommost memory layer (layer 0); the WL 154 with a next longest length is disposed in a next bottommost memory layer (layer 1); the WL 156 with a next shortest length is disposed in a next topmost memory layer (layer 2); and the WL 158 with a shortest length is disposed in a topmost memory layer (layer 3). Further, the WLs 152 to 158 can be grouped into a number of subsets that are laterally (e.g., along the X direction) spaced from one another, with the dielectric trench 113 interposed therebetween.

With other features (not shown in FIG. 1) such as, for example, a number of vertically extending conductive structures (e.g., functioning as bit lines (BLs) and/or source lines (SLs)) coupled to the memory portion 110, a number of memory strings, each of which includes a number of vertically spaced memory cells, can be functionally defined. For example in FIG. 1, memory strings 116A, 116B, 116C, 116D, 116E, 1116F, 116G, 116H, 116I, and 116J are included in the memory device 100. Each of the memory strings 116A to 116J, formed by at least a corresponding memory layer 112 and a corresponding semiconductor layers 114, has a number of memory cells disposed in respectively different memory layers. These memory cells (of a memory string) are electrically coupled to the corresponding subset of WLs 152 to 158, respectively. Referring still to the example of FIG. 1, the memory strings 116A to 116J each have four memory cells that are coupled to the WLs, 152, 154, 156, and 158, respectively. In some embodiments, the WL can function as the respective gate of each corresponding memory cell, and each memory cell can have the corresponding memory layer function as its gate dielectric and the corresponding semiconductor layer can function as its controllable conduction channel.

Each of the WLs is operatively (e.g., electrically) coupled to a corresponding WL driver. In general, each WL driver is configured to activate (or otherwise assert) the corresponding WL, for example, by applying a first voltage signal that corresponds to a high logical state, and deactivate (or otherwise de-assert) the corresponding WL, for example, by applying a second voltage signal that corresponds to a low logical state. For example, a WL driver can apply the first voltage signal to a corresponding WL, in which the first voltage signal may remain constant for a short period of time. Further, a WL decoder (or pre-decoder) can be operatively coupled to a number of WL drivers. As such, the WL decoder can select which of the WL drivers to be activated based on a decoded address, which can in turn activate a corresponding WL.

As shown, these WL drivers, included in or otherwise integrated with the memory device 100, are disposed below the memory array portion 110 and interface portion 150, in some embodiments. Each WL can be coupled to the corresponding WL driver through a number of interconnect structures. For example in FIG. 1, the memory device 100 includes interconnect structures 153, 155, 157, 159, 161, 163, 165, 167, 169, 171, 173, and 175, each of which is formed of a metal material (e.g., copper, aluminum, or any of various other suitable metal materials). The interconnect structures 153 to 159 and 169 to 175 are each formed as a vertically extending structure (e.g., a via), and the interconnect structures 161 to 167 are each formed as a laterally extending structure (e.g., a conductive line), in some embodiments. Further, the WL 152 is coupled to a WL driver 180 through via 153, conducive line 161, and then via 169; the WL 154 is coupled to a WL driver 182 through via 155, conducive line 163, and then via 171; the WL 156 is coupled to a WL driver 184 through via 157, conducive line 165, and then via 173; and the WL 158 is coupled to a WL driver 186 through via 159, conducive line 167, and then via 175.

Figure 2:
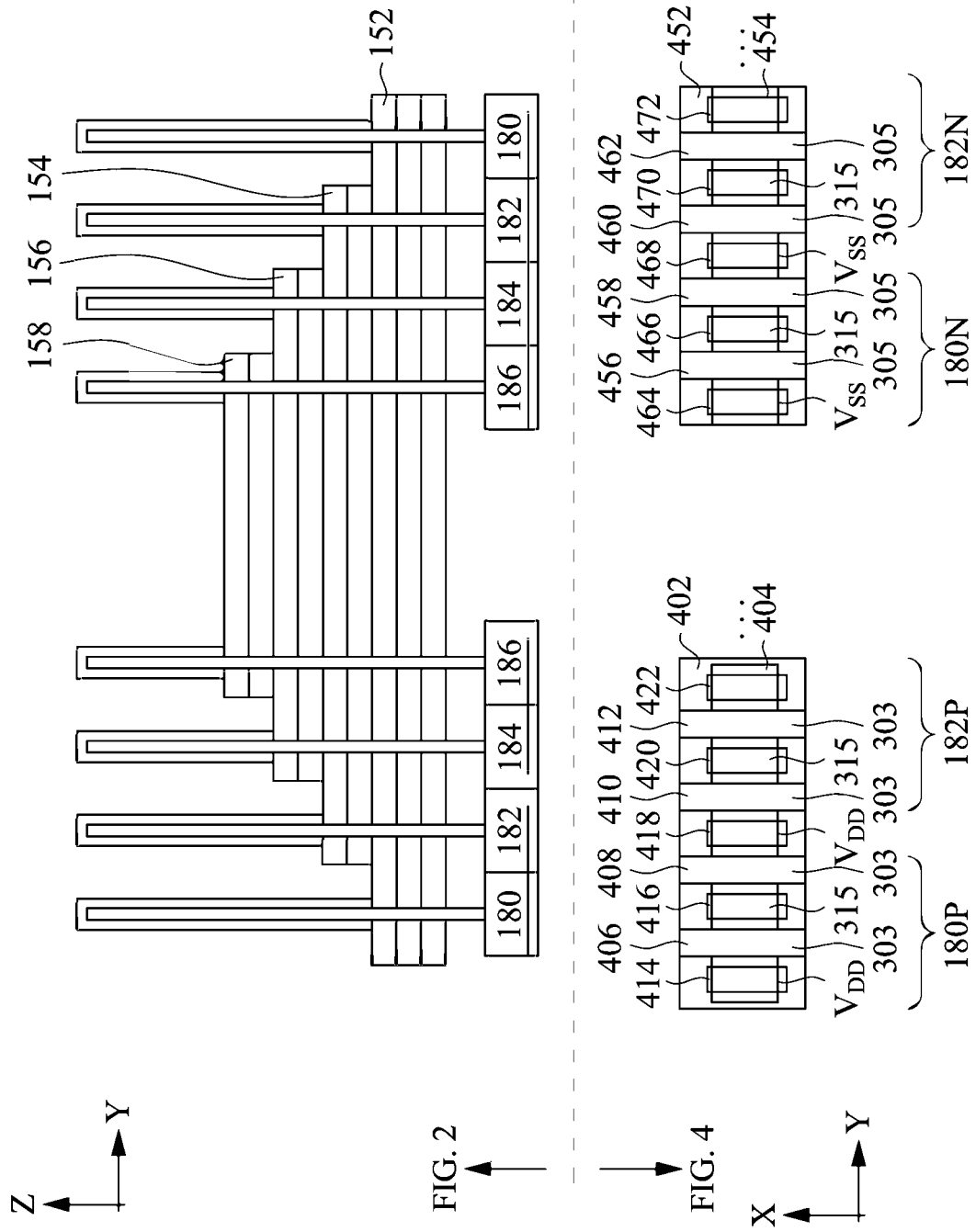
FIG. 2 illustrates a cross-sectional view of the memory device of FIG. 1, in accordance with some embodiments.

Such coupled WLs and WL drivers can be better illustrated in a cross-sectional view of FIG. 2 that is cut along the Y-Z plane, which travels across a subset of the WLs 152 to 158 (e.g., the WLs 152 to 158 vertically disposed in respectively different memory layers and laterally isolated from other subsets of the WLs 152 to 158). As shown in FIG. 2, such a subset of WLs 152 to 158 form a staircase profile with two staircases disposed on opposite sides of the memory portion 110 (which includes the plural memory strings forming a 3D memory array) along the Y direction. Each of the WL drivers includes two conductive types of transistors (e.g., one n-type transistor and two n-type transistors), which will be discussed in further detail with respect to FIG. 3. The two conductive types of transistors can be formed on opposite sides of the memory array, in accordance with various embodiments. Further, the same conductive type of transistors among the WL drivers in different memory layers can share a same active region, in accordance with various embodiments.

Figure 3:
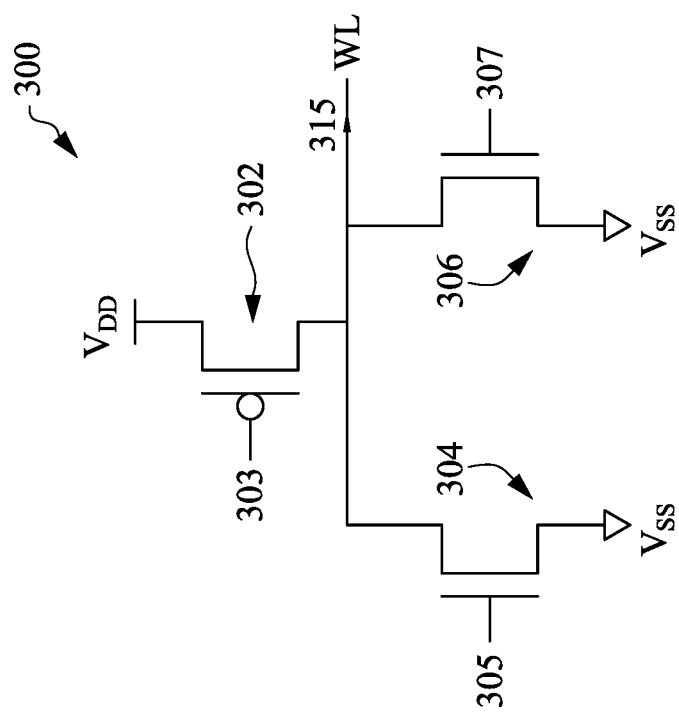
FIG. 3 illustrates an example circuit diagram of one of the WL drivers of the memory device of FIG. 1, in accordance with some embodiments.

Referring now to FIG. 3, an example equivalent circuit (diagram) 300 of one of the WL drivers 180 to 186 is illustrated, in accordance with various embodiments. The circuit 300 includes transistors 302, 304, and 306. In various embodiments, the transistor 302 has a first conductive type, e.g., p-type, and the transistors 304 and 306 each have a second, opposite conductive type, e.g., n-type. Accordingly, the transistors 302 to 306 are herein referred to as PMOS 302, NMOS 304, and NMOS 306, respectively. A PMOS, when turned on, conducts holes (sometimes referred to as a p-type channel); and an NMOS, when turned on, conducts electrons (sometimes referred to as an n-type channel), in accordance with some embodiments. The PMOS typically has its p-type source and drain structures/regions formed over an n-type substrate, and the NMOS typically has its p-type source and drain structures/regions formed over a p-type substrate.

As shown in FIG. 3, the PMOS 302 and NMOS's 304-306 are coupled between a first supply voltage (e.g., VDD) and a second supply voltage (e.g., VSS). Further, each of the PMOS 302 and NMOS's 304-306 has its gate coupled to a control signal, which allows the circuit 300 (i.e., a WL driver) to provide an output signal to a corresponding WL based on those control signals. The control signals may be associated with the decoded address mentioned above. For example, the PMOS 302 is gated by a control signal 303, the NMOS 304 is gated by a control signal 305, and the NMOS 306 is gated by a control signal 307, where the control signals 303 and 305 may be the same. Based on a logical combination of the control signals, the circuit 300 can provide an output signal 315 to the coupled WL.

Referring then to FIG. 4, a portion of a layout 400 of the WL drivers 180 to 186 coupled to a subset of the WLs 152 to 158 is illustrated, in accordance with various embodiments of the present disclosure. It should be noted that the layout 400 of FIG. 4 is merely illustrated as an example, and should not limit a scope of the present disclosure. For instance, relative arrangements of the patterns illustrated in the layout 400 can be rearranged, while remaining within the scope of the present disclosure.

The layout 400 includes patterns 402 and 452 to form a first well and a second well over a semiconductor substrate. The first well has a first conductive type (e.g., n-type) used to form a number of PMOS's, and the second well has a second conductive type (e.g., p-type) used to form a number of NMOS's. Accordingly, the patterns 402 and 452 are herein referred to as n-well (NW) 402 and p-well (PW) 452, respectively. In accordance with various embodiments, the NW 402 and PW 452 are spaced apart from each other over the substrate. For example, the NW 402 and PW 452 may be respectively disposed on opposite sides of the memory array portion 110 along the Y direction (FIG. 1). Further, the NW 402 and PW 452 may extend along the same first lateral direction (e.g., the Y direction) with a certain distance (or length), which allows the same conductive type of transistors of different WL drivers to be compactly and laterally arranged with each other. As will be discussed below, the layout 400, as disclosed herein, has the NW 402 and PW 452 extending along the same second lateral direction, which allows the same conductive type of transistors of other different WL drivers to be compactly and laterally arranged with each other. As such, a total area of the layout 400 (in turn, a total area of the memory device 100) can be significantly reduced.

Within the NW 402, the layout 400 includes a pattern 404 configured to form a first active region (which is sometimes referred to as an oxide diffusion region) having the same conductive type as the NW 402. Similarly, within the PW 452, the layout 400 includes a pattern 454 configured to form a second active region (which is sometimes referred to as an oxide diffusion region) having the same conductive type as the PW 452. The patterns 404 and 454 are herein referred to as "active region 404" and "active region 454," respectively. The active regions 404 and 454 can both extend along the same lateral direction, for example, the Y direction. The active region 404/454 can define the footprints of a channel and source/drain regions of each of one or more transistors, which will be discussed in further detail below.

Over the NW 402, the layout 400 includes a number of patterns 406, 408, 410, and 412. The patterns 406 to 412 travel across the active region 404 by extending along a lateral direction orthogonal to the lengthwise direction of the active regions, e.g., the X direction. Similarly, over the PW 452, the layout 400 includes a number of patterns 456, 458, 460, and 462 extending along the X direction. The patterns 406 to 412 and 456 to 462 are each configured to form a gate structure. Accordingly, the patterns 406 to 412 and 456 to 462 are herein referred to as gate structures 406 to 412 and 456 to 462, respectively. In some embodiments, the portion of an active region overlaid (or otherwise traversed) by a gate structure can define the channel of a transistor. Further, portions of the active region on opposite sides of the traversing gate structure can define source and drain structures of the transistor, respectively.

Over the active region 404, the layout 400 further includes a number of patterns 414, 416, 418, 420, and 422. The patterns 414 to 422 travel across the active region 404 by extending along a lateral direction orthogonal to the lengthwise direction of the active regions, e.g., the X direction. Similarly, over the active region 454, the layout 400 further includes a number of patterns 464, 466, 468, 470, and 472 extending along the X direction. The patterns 414 to 422 and 464 to 472 are each configured to form an interconnect structure electrically coupled to a corresponding source or drain structure, which is sometimes referred to as an "MD." Accordingly, the patterns 414 to 422 and 464 to 472 are herein referred to as MDs 414 to 422 and 464 to 472, respectively.

The layout 400 shown in FIG. 4 can define the PMOS 302 and NMOS's 304-306 (300 of FIG. 3) for each of the WL drivers 180 and 182, in accordance with various embodiments. For example over the NW 402, the gate structures 406 and 408 collectively define a gate of the PMOS 302 of the WL driver 180 (which is connected to the control signal 302), where portions of the active region 404 overlaid by the gate structures 406 and 408 collectively define a channel of the PMOS 302. Further, the MD 414 electrically couples one of the source or drain of the PMOS 302 to VDD, and the MD 416 outputs the other of the source or drain of the PMOS 302 as the output signal 315. Similarly, for example over the PW 452, the gate structure 456 defines a gate of the NMOS 304 of the WL driver 180 (which is connected to the control signal 305), where portions of the active region 454 overlaid by the gate structure 456 defines a channel of the NMOS 304; and the gate structure 458 defines a gate of the NMOS 306 of the WL driver 180 (which is connected to the control signal 307), where a portion of the active region 454 overlaid by the gate structure 458 defines a channel of the NMOS 306. Further, the MD 464 electrically couples one of the source or drain of the NMOS 304 to VSS, the MD 468 electrically couples one of the source or drain of the NMOS 306 to VSS, and the MD 466 outputs the other of the source or drain of the NMOS 304 and the other of the source or drain of the NMOS 306 as the output signal 315.

As such, the PMOS 302 and NMOS's 304-306 of the WL driver 180 can be formed by a first portion of the structures formed in the NW 402 (e.g., over the active region 404) and a first portion of the structures in the PW 452 (e.g., over the active region 454), respectively. Such first portions formed in the NW 402 and PW 452 are sometimes referred to as transistor 180P and transistor 180N, respectively, as indicated in FIG. 4. Based on the same principle, the same conductive type of transistors of other WL drivers (e.g., 182, 184, 186) can be formed over the corresponding common active region.

For example, the PMOS 302 of the WL driver 182 can be formed by a second portion of the structures in the active region 404 (e.g., the gate structures 410-412 collectively coupled to the corresponding control signal 303, the MD 418 coupled to VDD, and the MD 420 outputting the corresponding output signal 315). The NMOS's 304-306 of the WL driver 182 can be formed by a second portion of the structures in the active region 454 (e.g., the gate structures 460 and 462 coupled to the corresponding control signals 305 and 307, the MD 470 outputting the corresponding output signal 315, and the MD 472 coupled to VSS). Such second portions formed in the NW 402 and PW 452 are sometimes referred to as transistor 182P and transistor 182N, respectively, as indicated in FIG. 4. Additionally, over the same active region, the transistors of neighboring ones of the WL drivers 180 to 186 may be disposed immediately adjacent to each other. For example in FIG. 4, transistor 180P is disposed immediately adjacent to transistor 182P, and transistor 180N is disposed immediately adjacent to transistor 182N.

Figure 5:
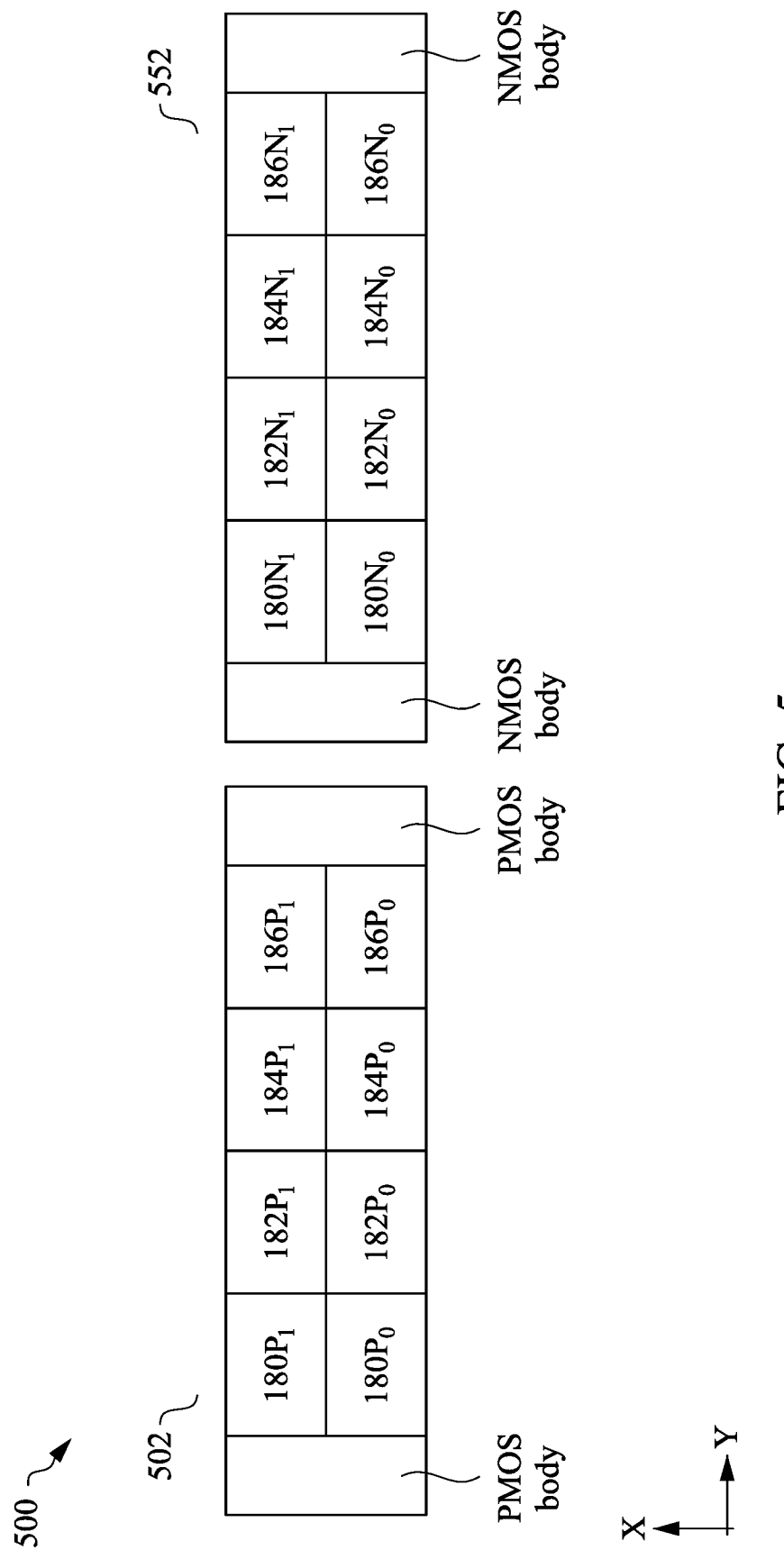
FIG. 5 illustrates an example layout of the WL drivers of the memory device of FIG. 1, in accordance with some embodiments.

FIG. 5 illustrates an example layout 500 for forming (e.g., 2) subsets of WL drivers 180 to 186 of the memory device 100, in accordance with various embodiments. These subsets of WL drivers 180 to 186 may be coupled to different subsets of WLs 152 to 158, respectively. While being (e.g., electrically) isolated from one another, these different subsets of WLs 152 to 158 may be disposed next to one another along a lateral direction. For example in FIG. 1, these subsets of WLs 152 to 158 may be separated from one another with one of the dielectric trenches 113 interposed therebetween. These subsets of WLs 152 to 158 may be coupled to neighboring ones of the memory strings (e.g., 116A and 116B, 116C and 116D, etc.), respectively. Further, each WL of one subset is disposed in the same memory layer as a corresponding WL of another subset.

As shown, the layout 500 includes an NW 502 and a PW 552. Each of the NW 502 and PW 522 has a portion lined by a body structure or region. Such a body region may have the same conductive type as its corresponding well region, with a higher doping concentration. The body region may be floating or tied to a fixed voltage, which can serve as a (e.g., voltage) reference point for the transistors formed in the corresponding well region. For example, the NW 502 has at least two of its edges each lined by a PMOS body (e.g., doped with $n^+$ dopants); and the PW 522 has at least two of its edges each lined by an NMOS body (e.g., doped with $p^+$ dopants).

Referring still to FIG. 5, within the NW 502, the layout 500 includes a number of portions configured to form the PMOS's 302 of multiple subsets of WL drivers 180 to 186; and within the PW 552, the layout 500 includes a number of portions configured to form the NMOS's 304 and 306 of multiple subsets of WL drivers 180 to 186. For example, the layout 500, within the NW 502, includes portions $180P_0$, $182P_0$, $184P_0$, $186P_0$, $180P_1$, $182P_1$, $184P_1$, and $186P_1$; and the layout 500, within the PW 552, includes portions $180N_0$, $182N_0$, $184N_0$, $186N_0$, $180N_1$, $182N_1$, $184N_1$, and $186N_1$. In some embodiments, each of the portions in the NW 502 is substantially similar to the portions described with respect to the layout 400 of FIG. 4, e.g., 180P, 182P, etc.; and each of the portions in the PW 552 is substantially similar to the portions described with respect to the layout 400 of FIG. 4, e.g., 180N, 182N, etc.

For example, each of the portions $180P_0$ to $186P_1$ encloses or otherwise includes a number of structures (patterns) that can form the PMOS of a corresponding WL driver (e.g., 302); and each of the portions $180N_0$ to $186N_1$ encloses or otherwise includes a number of structures (patterns) that can form the NMOS's of a corresponding WL driver (e.g., 304 and 306). Specifically, the portions $180P_0$, $182P_0$, $184P_0$, and $186P_0$, which share the same first active region extending along the Y direction, can form the PMOS's of a first subset of WL drivers 180 to 186, respectively; and the portions $180P_1$, $182P_1$, $184P_1$, and $186P_1$, which share the same second active region extending along the Y direction, can form the PMOS's of a second subset of WL drivers 180 to 186, respectively. Similarly, the portions $180N_0$, $182N_0$, $184N_0$, and $186N_0$, which share the same first active region extending along the Y direction, can form the NMOS's of the first subset of WL drivers 180 to 186, respectively; and the portions $180N_1$, $182N_1$, $184N_1$, and $186N_1$, which share the same second active region extending along the Y direction, can form the NMOS's of the second subset of WL drivers 180 to 186, respectively.

Further, the portions of the layout 500 configured for forming the same conductive type of transistors of WL drivers that are disposed in the same memory layer can be disposed or otherwise arranged immediately next to each other (e.g., along the X direction), in accordance with various embodiments of the present disclosure. For example, in the NW 502, the portion $180P_1$, which is configured for forming the PMOS 302 of a first WL driver 180 disposed in layer 0, abut the portion $180P_0$, which is configured for forming the PMOS 302 of a second WL driver 180 also disposed in layer 0. Similarly, in the PW 552, the portion $180N_1$, which is configured for forming the NMOS's 304 and 306 of the first WL driver 180 disposed in layer 0, abut the portion $180N_0$, which is configured for forming the NMOS's 304 and 306 of the second WL driver 180 also disposed in layer 0.

By arranging the same conductive type of transistors of different subsets of WL drivers (e.g., $180P_0$ and $180P_1$, $182P_0$ and $182P_1$, $184P_0$ and $184P_1$, $186P_0$ and $186P_1$) in the same well region (e.g., NW 502), each of the NW 502 and PW 552 can have a substantially increased well width along the X direction. This increased well width can advantageously cause the well region to have a less resistance. Therefore, a chance of having the latch up issues among the WL drivers can be significantly reduced.

Figure 6:
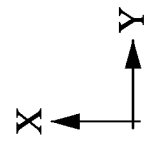
FIG. 6 illustrates an example layout of the WL drivers of the memory device of FIG. 1, in accordance with some embodiments.

FIG. 6 illustrates an example layout 600 for forming (e.g., 6) subsets of WL drivers 180 to 186 of the memory device 100, in accordance with various embodiments. These subsets of WL drivers 180 to 186 may be coupled to different subsets of WLs 152 to 158, respectively. While being (e.g., electrically) isolated from one another, these different subsets of WLs 152 to 158 may be disposed next to one another along a lateral direction. For example in FIG. 1, these subsets of WLs 152 to 158 may be separated from one another with one of the dielectric trenches 113 interposed therebetween. These subsets of WLs 152 to 158 may be coupled to neighboring ones of the memory strings (e.g., 116A and 116B, 116C and 116D, etc.), respectively. Further, each WL of one subset is disposed in the same memory layer as a corresponding WL of another subset.

As shown, the layout 600 includes an NW 602 having potions: $180P_0$, $182P_0$, $184P_0$, and $186P_0$ arranged with respect to one another along the Y direction; $180P_1$, $182P_1$, $184P_1$, and $186P_1$ arranged with respect to one another along the Y direction; $180P_2$, $182P_2$, $184P_2$, and $186P_2$ arranged with respect to one another along the Y direction; $180P_3$, $182P_3$, $184P_3$, and $186P_3$ arranged with respect to one another along the Y direction; $180P_4$, $182P_4$, $184P_4$, and $186P_4$ arranged with respect to one another along the Y direction; and $180P_5$, $182P_5$, $184P_5$, and $186P_5$ arranged with respect to one another along the Y direction.

In various embodiments, the portions $180P_0$ to $186P_0$ may include patterns/structures configured to form the PMOS's of a first subset of WL drivers 180 to 186, respectively; the portions $180P_1$ to $186P_1$ may include patterns/structures configured to form the PMOS's of a second subset of WL drivers 180 to 186, respectively; the portions $180P_2$ to $186P_2$ may include patterns/structures configured to form the PMOS's of a third subset of WL drivers 180 to 186, respectively; the portions $180P_3$ to $186P_3$ may include patterns/structures configured to form the PMOS's of a fourth subset of WL drivers 180 to 186, respectively; the portions $180P_4$ to $186P_4$ may include patterns/structures configured to form the PMOS's of a fifth subset of WL drivers 180 to 186, respectively; and the portions $180P_5$ to $186P_0$ may include patterns/structures configured to form the PMOS's of a sixth subset of WL drivers 180 to 186, respectively.

Further, the portions $180P_0$, $180P_1$, $180P_2$, $180P_3$, $180P_4$, and $180P_5$ correspond to the different WLs in the same memory layer 0, respectively, each of which is disposed immediately next to one or two of which along the X direction; the portions $182P_0$, $182P_1$, $182P_2$, $182P_3$, $182P_4$, and $182P_5$ correspond to the different WLs in the same memory layer 1, respectively, each of which is disposed immediately next to one or two of which along the X direction; the portions $184P_0$, $184P_1$, $184P_2$, $184P_3$, $184P_4$, and $184P_5$ correspond to the different WLs in the same memory layer 2, respectively, each of which is disposed immediately next to one or two of which along the X direction; and the portions $186P_0$, $186P_1$, $186P_2$, $186P_3$, $186P_4$, and $186P_5$ correspond to the different WLs in the same memory layer 3, respectively, each of which is disposed immediately next to one or two of which along the X direction.

Similarly, the layout 600 includes a PW 652 having portions: $180N_0$, $182N_0$, $184N_0$, and $186N_0$ arranged with respect to one another along the Y direction; $180N_1$, $182N_1$, $184N_1$, and $186N_1$ arranged with respect to one another along the Y direction; $180N_2$, $182N_2$, $184N_2$, and $186N_2$ arranged with respect to one another along the Y direction; $180N_3$, $182N_3$, $184N_3$, and $186N_3$ arranged with respect to one another along the Y direction; $180N_4$, $182N_4$, $184N_4$, and $186N_4$ arranged with respect to one another along the Y direction; and $180N_5$, $182N_5$, $184N_5$, and $186N_5$ arranged with respect to one another along the Y direction.

In various embodiments, the portions $180N_0$ to $186N_0$ may include patterns/structures configured to form the NMOS's of the first subset of WL drivers 180 to 186, respectively; the portions $180N_1$ to $186N_1$ may include patterns/structures configured to form the NMOS's of the second subset of WL drivers 180 to 186, respectively; the portions $180N_2$ to $186N_2$ may include patterns/structures configured to form the NMOS's of the third subset of WL drivers 180 to 186, respectively; the portions $180N_3$ to $186N_3$ may include patterns/structures configured to form the NMOS's of the fourth subset of WL drivers 180 to 186, respectively; the portions $180N_4$ to $186N_4$ may include patterns/structures configured to form the NMOS's of the fifth subset of WL drivers 180 to 186, respectively; and the portions $180N_5$ to $186N_0$ may include patterns/structures configured to form the NMOS's of the sixth subset of WL drivers 180 to 186, respectively.

Further, the portions $180N_0$, $180N_1$, $180N_2$, $180N_3$, $180N_4$, and $180N_5$ correspond to the different WLs in the same memory layer 0, respectively, each of which is disposed immediately next to one or two of which along the X direction; the portions $182N_0$, $182N_1$, $182N_2$, $182N_3$, $182N_4$, and $182N_5$ correspond to the different WLs in the same memory layer 1, respectively, each of which is disposed immediately next to one or two of which along the X direction; the portions $184N_0$, $184N_1$, $184N_2$, $184N_3$, $184N_4$, and $184N_5$ correspond to the different WLs in the same memory layer 2, respectively, each of which is disposed immediately next to one or two of which along the X direction; and the portions $186N_0$, $186N_1$, $186N_2$, $186N_3$, $186N_4$, and $186N_5$ correspond to the different WLs in the same memory layer 3, respectively, each of which is disposed immediately next to one or two of which along the X direction.

Figure 7:
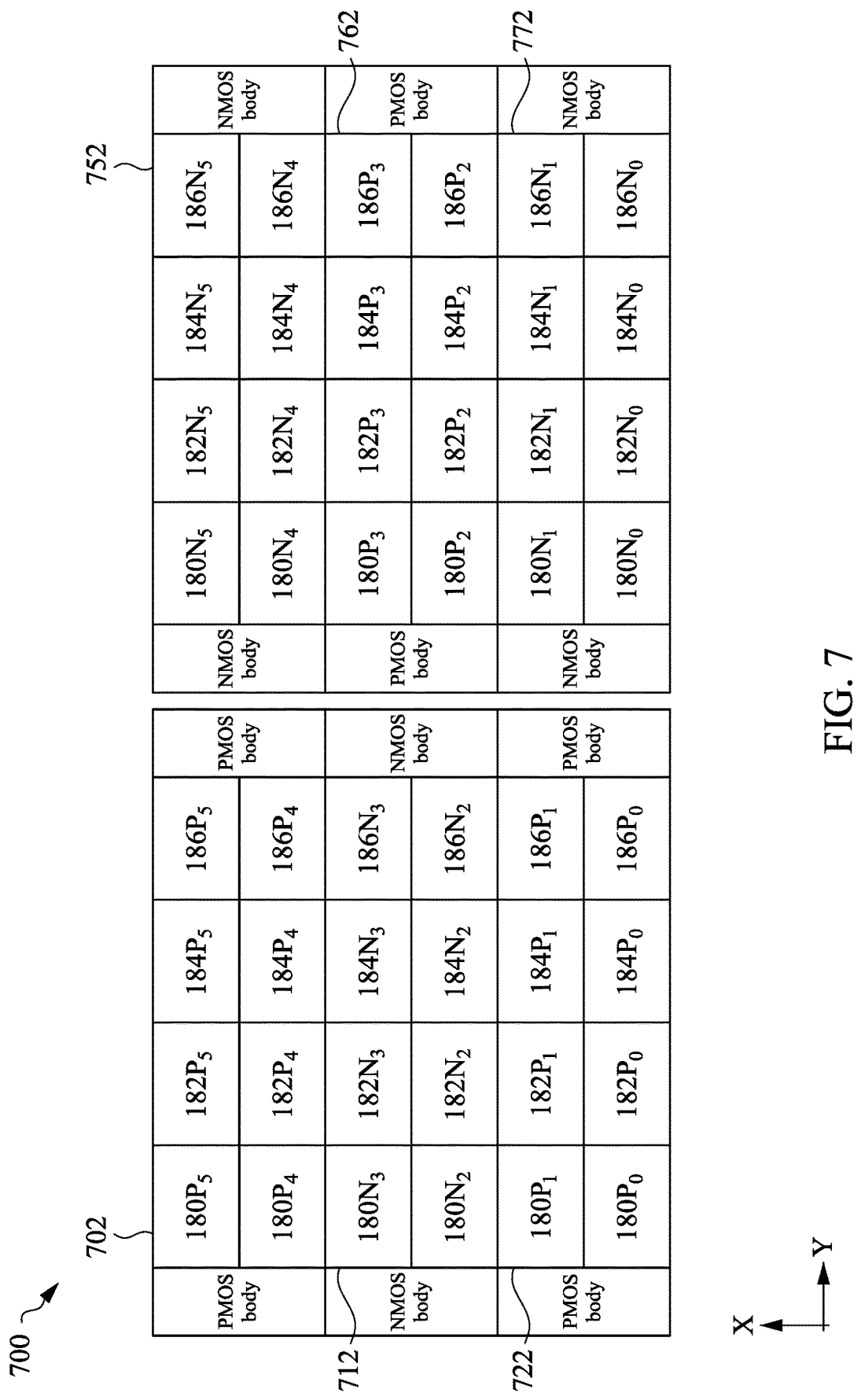
FIG. 7 illustrates an example layout of the WL drivers of the memory device of FIG. 1, in accordance with some embodiments.

FIG. 7 illustrates an example layout 700 for forming (e.g., 6) subsets of WL drivers 180 to 186 of the memory device 100, in accordance with various embodiments. These subsets of WL drivers 180 to 186 may be coupled to different subsets of WLs 152 to 158, respectively. While being (e.g., electrically) isolated from one another, these different subsets of WLs 152 to 158 may be disposed next to one another along a lateral direction. For example in FIG. 1, these subsets of WLs 152 to 158 may be separated from one another with one of the dielectric trenches 113 interposed therebetween. These subsets of WLs 152 to 158 may be coupled to neighboring ones of the memory strings (e.g., 116A and 116B, 116C and 116D, etc.), respectively. Further, each WL of one subset is disposed in the same memory layer as a corresponding WL of another subset.

As shown, the layout 700 includes multiple NWs 702, 722, and 762; and multiple PWs 712, 752, and 772. Each of the NWs 702 to 762 has at least two of its edges each lined by a PMOS body, and each of the PWs 712 to 772 has at least two of its edges each lined by an NMOS body. Further, the NWs and PWs may be alternately arranged with one another, in some embodiments. For example, the PW 712 is interposed between the NWs 702 and 722 along the X direction, while the NW 762, aligned with the PW 712 along the Y direction, is interposed between the PWs 752 and 772 along the X direction.

Specifically, the NW 702 has potions: $180P_4$, $182P_4$, $184P_4$, and $186P_4$ arranged with respect to one another along the Y direction; and portions $180P_5$, $182P_5$, $184P_5$, and $186P_5$ arranged with respect to one another along the Y direction. The PW 712 has potions: $180N_3$, $182N_3$, $184N_3$, and $186N_3$ arranged with respect to one another along the Y direction; and portions $180N_2$, $182N_2$, $184N_2$, and $186N_2$ arranged with respect to one another along the Y direction. The NW 722 has potions: $180P_1$, $182P_1$, $184P_1$, and $186P_1$ arranged with respect to one another along the Y direction; and portions $180P_0$, $182P_0$, $184P_0$, and $186P_0$ arranged with respect to one another along the Y direction. The PW 752 has potions: $180N_5$, $182N_5$, $184N_5$, and $186N_5$ arranged with respect to one another along the Y direction; and portions $180N_4$, $182N_4$, $184N_4$, and $186N_4$ arranged with respect to one another along the Y direction. The NW 762 has potions: $180P_3$, $182P_3$, $184P_3$, and $186P_3$ arranged with respect to one another along the Y direction; and portions $180P_2$, $182P_2$, $184P_2$, and $186P_2$ arranged with respect to one another along the Y direction. The PW 772 has potions: $180N_1$, $182N_1$, $184N_1$, and $186N_1$ arranged with respect to one another along the Y direction; and portions $180N_0$, $182N_0$, $184N_0$, and $186N_0$ arranged with respect to one another along the Y direction.

In some additional embodiments, the memory device 100 can include a number of selector gate devices (e.g., transistors), which can further reduce the total area of the memory device 100. One or more of the selector gate devices can divide a subset of the WLs of the memory device 100 (e.g., disposed in the same memory layer but laterally isolated from each other) into plural groups. By having the selector gate devices, plural WLs can be operatively coupled to a common WL driver. Alternatively stated, the same conductive type of transistors of plural WL drivers can share the same active region, which can further the width of a corresponding well region. In turn, a resistance of the well region can be reduced.

Figure 8:
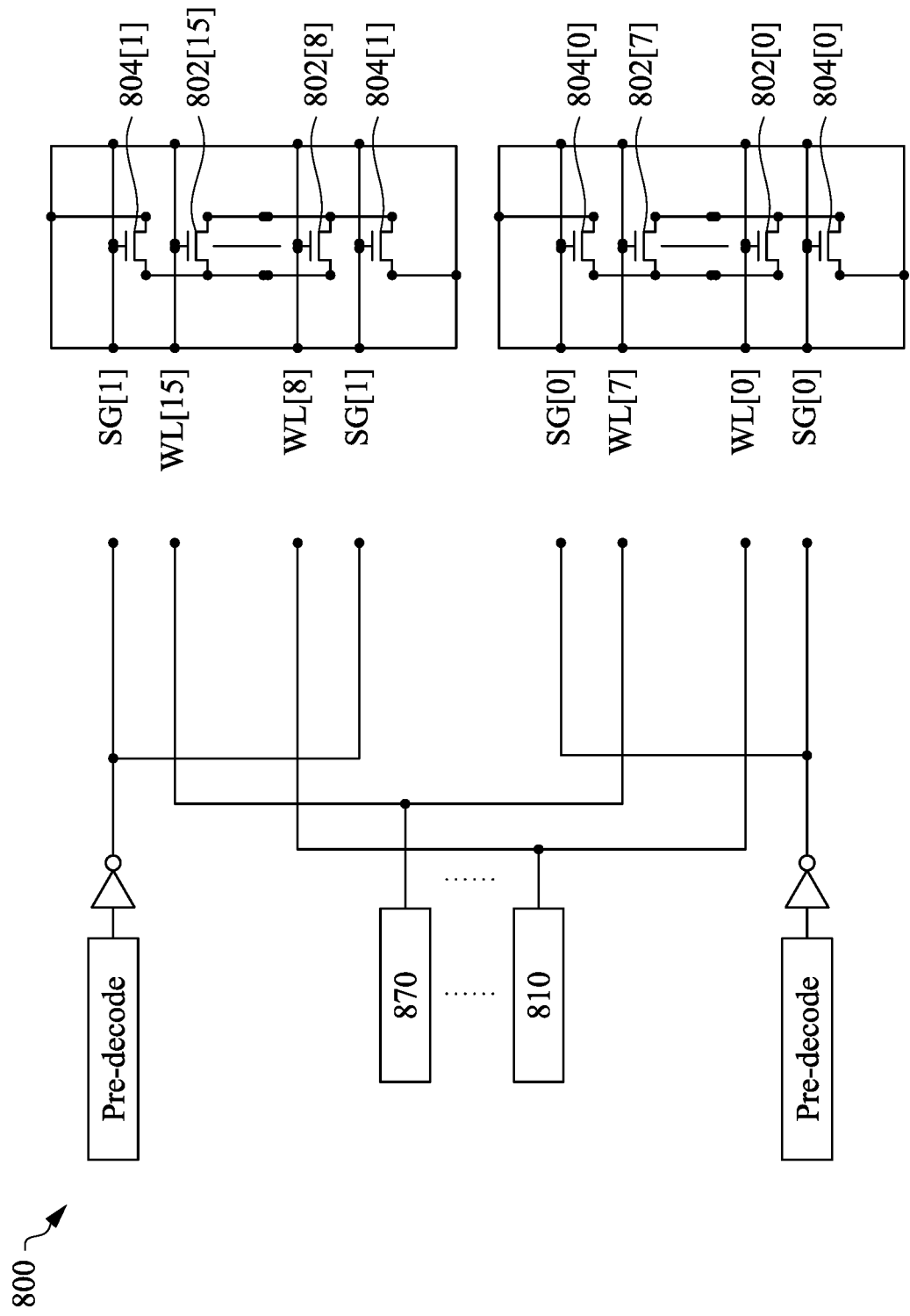
FIG. 8 illustrates an example circuit diagram of a portion of the memory device of FIG. 1, including a number of common WL drivers, in accordance with some embodiments.

FIG. 8 illustrates an example equivalent circuit (diagram) 800 of a portion of the memory device 100 including such selector gate devices, in accordance with various embodiments. For example, the circuit 800 shows a subset of the WLs disposed in the same memory layer but laterally isolated from one another of the memory device 100 (e.g., a subset of WLs 152, a subset of WLs 154, a subset of WLs 156, or a subset of WLs 158). Two of more of these WLs may be operatively coupled to a common WL driver with the selector gate devices. In some embodiments, these WLs may be coupled to respective different memory strings.

As shown, the circuit 800 includes WL[0] . . . WL[7] and WL[8] . . . WL[15], which are coupled to memory cells (shown as transistors in FIGS. 8) 802[0] . . . 802[7] and 802[8] . . . 802[15], respectively. The circuit 800 further includes selector gate devices 804[0] and 804[1]. The selector gate device 804[0] is coupled to the memory cells 802[0] . . . 802[7], and the selected gate device 804[1] is coupled to the memory cells 802[8] . . . 802[15]. By having the selector gate devices 804[0] and 804[1], the memory cells 802[0] to 802[7] can be coupled to a first portion of a source line, SL[0] and a first portion of the SL[0], and the memory cells 802[8] to 802[15] can be coupled to a second portion of the SL[0] and a second portion of the SL[0].

The selector gate devices 804[0] may be activated (e.g., gated) by a first control signal SG[0], and the selector gate devices 804[1] may be activated by a second control signal SG[1]. The control signals SG[0] and SG[1] may be provided through respective WL decoders (or pre-decoders) and corresponding inverters, as shown. The selector gate devices 804[0] and selector gate devices 804[1] may be alternately activated, which allows two of the WL[0] to WL[15] to be operatively coupled to a common WL driver. For example in FIG. 8, the WL[0] and WL[8] are coupled to a WL driver 810, and the WL[7] and WL[15] are coupled to a WL driver 870. Each of the WL drivers includes an inverter (formed of two conductive types of transistors as discussed with respect to FIG. 3) coupled to a WL decoder (or pre-decoder). With one of the selector gate devices 804[0] or 804[1] being turned on (by the alternately activated control signals SG[0] and SG[1]), the WL driver 810, even coupled to both of the WL[0] and WL[8], can singly assert one of the WL[0] or WL[8].

Figure 9:
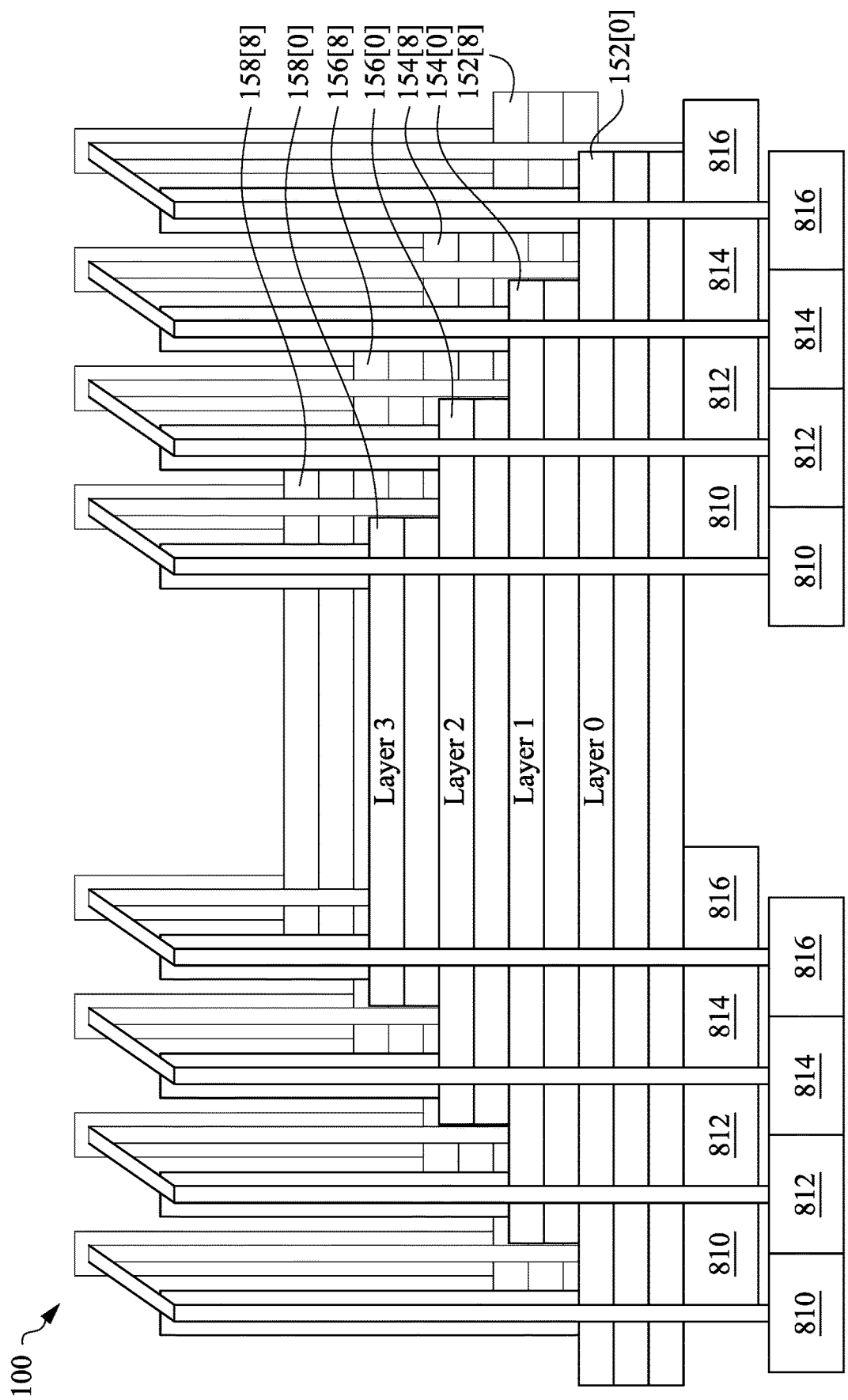
FIG. 9 illustrates a cross-sectional view of the memory device of FIG. 1, corresponding to the portion of FIG. 8 that has a number of common WL drivers, in accordance with some embodiments.

FIG. 9 illustrates a portion of the memory device 100 that has such laterally isolated WLs coupled to a common WL driver, in accordance with various embodiments. As shown, WL 152[0] and WL 152[8] are disposed in the same memory layer 0; WL 154[0] and WL 154[8] are disposed in the same memory layer 1; WL 156[0] and WL 156[8] are disposed in the same memory layer 2; and WL 158[0] and WL 158[8] are disposed in the same memory layer 3. The WL 152[0] and WL 152[8] can correspond to the WL [0] and WL[8] of the circuit 800 (FIG. 8), respectively, in some embodiments. As such, the WL 152[0] and WL 152[8] are coupled to the same WL driver 810. Further, the WL 154[0] and WL 154[8] are coupled to a common WL driver 812; the WL 156[0] and WL 156[8] are coupled to a common WL driver 814; and the WL 158[0] and WL 158[8] are coupled to a common WL driver 816. According to various embodiments of the present disclosure, each of the WL drivers 810 to 816 has its two different conductive type of transistors formed in spaced well regions (as discussed above).

Figure 10:
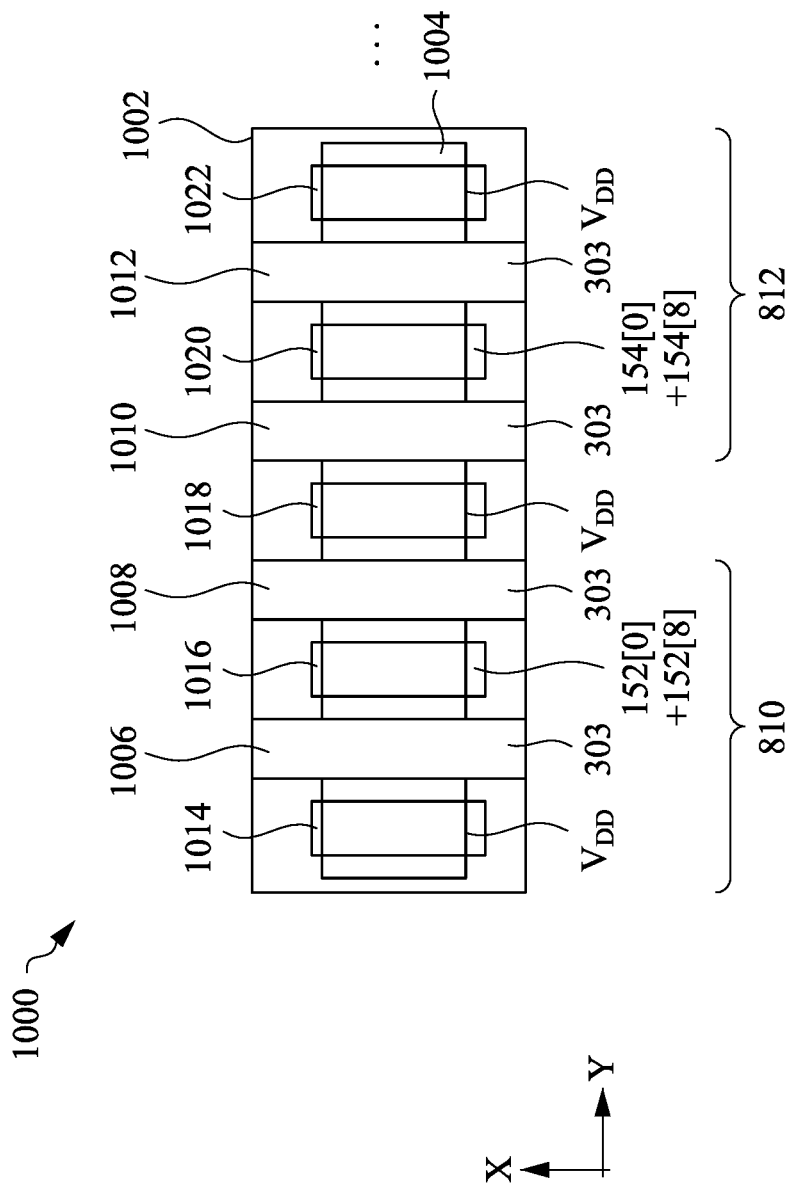
FIG. 10 illustrates an example layout of the common WL drivers of FIG. 9, in accordance with some embodiments.

FIG. 10 illustrates a portion of an example layout 1000 for forming one conductive type of transistors of one or more these common WL drivers, in accordance with various embodiments. For example, the layout 1000 shown in FIG. 10 can be used to form the WL drivers 810 and 812 of FIG. 9. In some embodiments, the layout 1000 is substantially similar to the layout 400 of FIG. 4, and thus the layout 1000 will be briefly described as follows.

The layout 1000 includes an NW 1002, an active region 1004, a number of gate structures 1006, 1008, 1010, and 1012, and a number of MDs 1014, 1016, 1018, 1020, and 1022. The gate structures 1006 and 1008 can collectively function as a gate of the PMOS 302 of the WL driver 810 (which is coupled to the same control signal 303), with the MDs 1014 and 1018 coupled to VDD and the MD 1016 coupled to both of the WL 152[0] and WL 152[8]. Similarly, the gate structures 1010 and 1012 can collectively function as a gate of the PMOS 302 of the WL driver 812 (which is coupled to the same control signal 303), with the MDs 1018 and 1022 coupled to VDD and the MD 1020 coupled to both of the WL 154[0] and WL 154[8].

Figure 11:
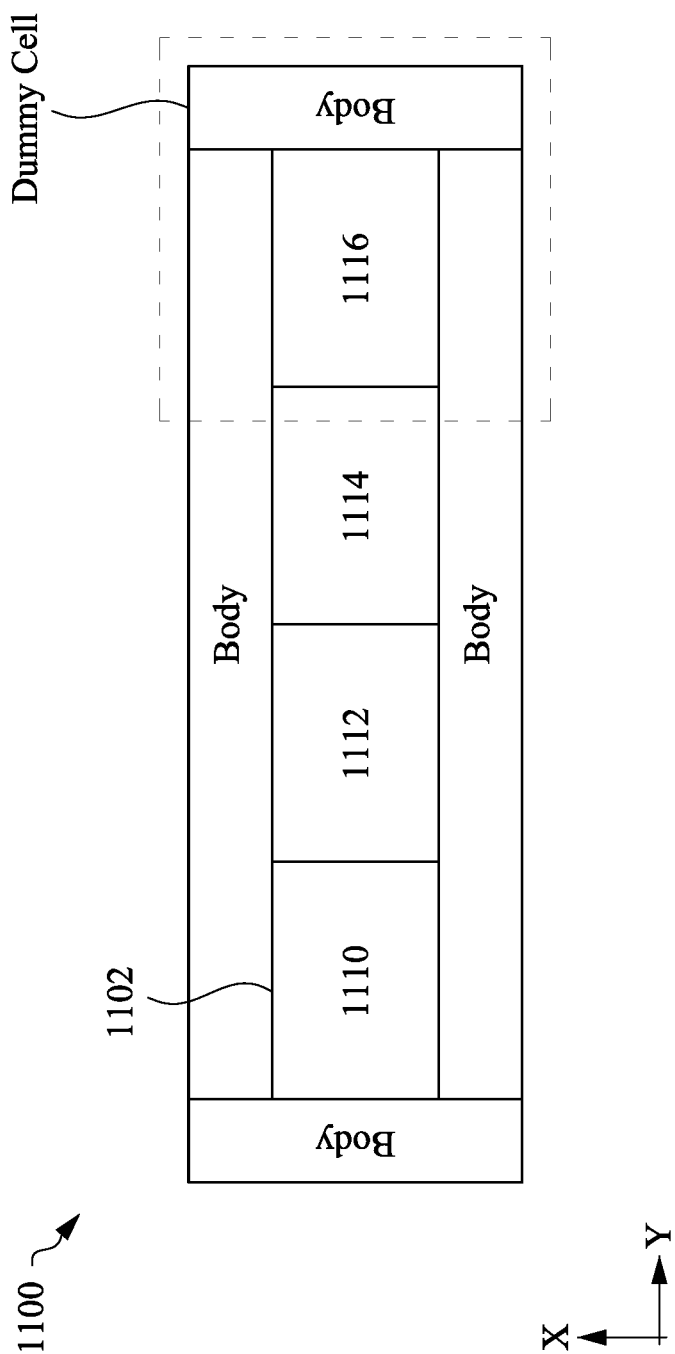
FIG. 11 illustrates an example layout of a portion of the memory device of FIG. 1, including at least one dummy cell, in accordance with some embodiments.

FIG. 11 illustrates an example layout 1100 for forming one conductive type of transistors of a number of the WL drivers of the memory device 100, in accordance with various embodiments. As shown, the layout 1100 includes a well region 1102 having its edges each lined by a body. The layout 1100 includes a number of portions 1110, 1112, 1114, and 116, each of which is configured to form one or more WL drivers. Along at least one edge of the well region 1102, the layout 1100 may have a full WL driver or a partial WL driver serve as a dummy cell, in accordance with various embodiments. Such a dummy cell may not function as an active WL driver, e.g., not operatively coupled to a control signal or outputting an output signal to a WL.

Figure 12:
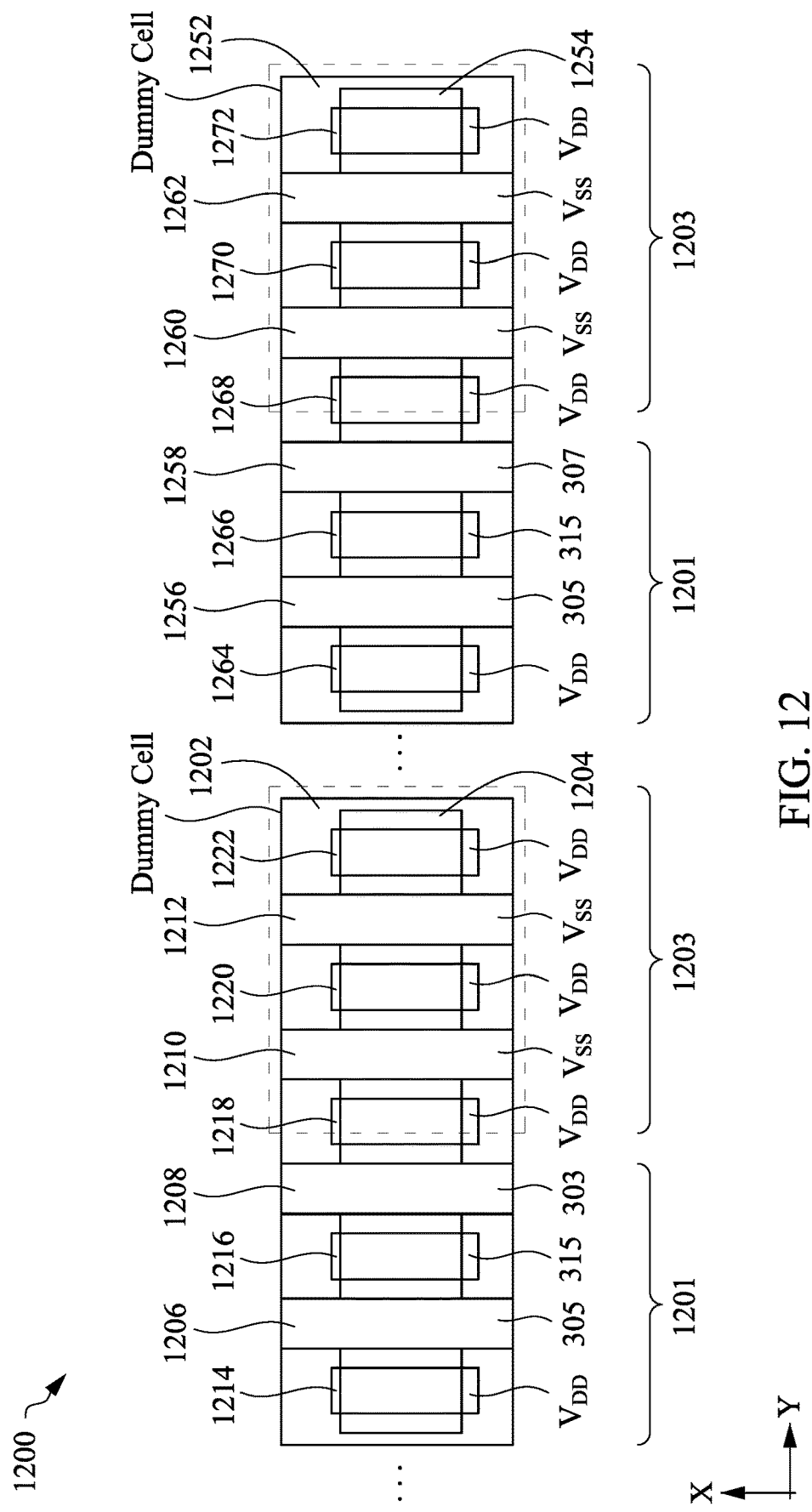
FIG. 12 illustrates an example layout of the portion of the memory device of FIG. 11, in accordance with some embodiments.

FIG. 12 illustrates a portion of an example layout 1200 that has one of such dummy cells, in accordance with various embodiments. As shown, the layout 1200 includes an NW 1202 and a PW 1252. In the NW 1202, the layout 1200 includes: an active region 1204, a number of gate structures 1206, 1208, 1210, and 1212, and a number of MDs 1214, 1216, 1218, 1220, and 1222; and in the PW 1252, the layout 1200 includes: an active region 1254, a number of gate structures 1256, 1258, 1260, and 1262, and a number of MDs 1264, 1266, 1268, 1270, and 1272. The gate structure 1212 may be disposed closet to one of the edges of the NW 1202 than any other gate structures, and the gate structure 1262 may be disposed closet to one of the edges of the PW 1252 than any other gate structures.

In some embodiments, the gate structures 1206 and 1208 can collectively function as a gate of the PMOS 302 of a WL driver 1201 (which is coupled to the same control signal 303), with the MDs 1214 and 1218 coupled to VDD and the MD 1216 coupled to at least one corresponding WL. The gate structures 1210 and 1212 can collectively function as a gate of the PMOS 302 of a WL driver 1203 (which is tied to VSS), with the MDs 1218 to 1222 all tied to VDD. The gate structures 1256 and 1258 can function as gates of the NMOS 304 and NMOS 306 of the WL driver 1201 (which are coupled to the control signals 305 and 307, respectively), with the MDs 1264 and 1268 coupled to VDD and the MD 1266 coupled to at least one corresponding WL. The gate structures 1260 and 1262 function as gates of the NMOS 304 and NMOS 306 of the WL driver 1203 (which are tied to VSS), with the MDs 1268 to 1272 all tied to VDD. As such, the whole WL driver 1203 may function as a dummy cell.

Figure 13:
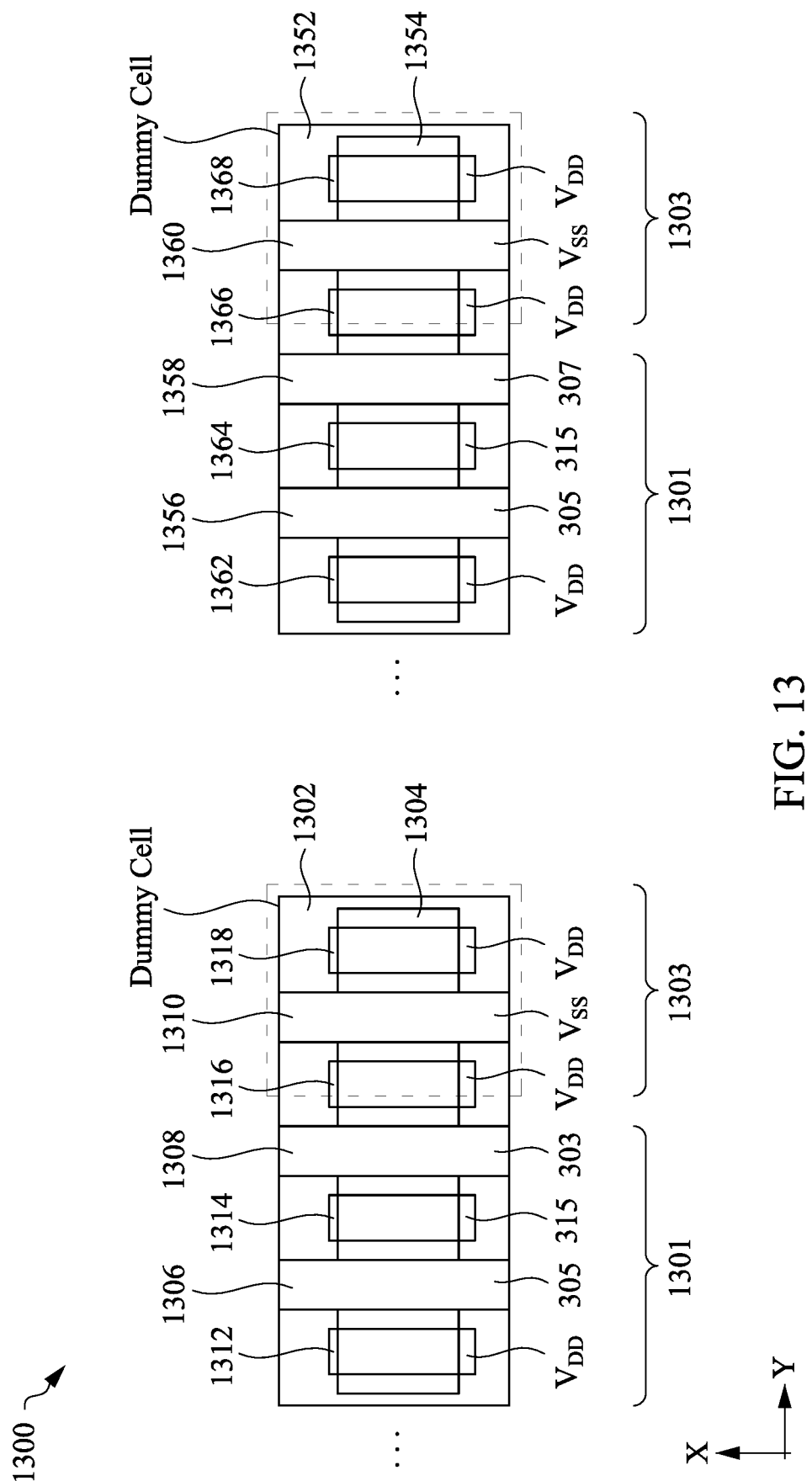
FIG. 13 illustrates an example layout of the portion of the memory device of FIG. 11, in accordance with some embodiments.

FIG. 13 illustrates a portion of an example layout 1300 that has one of such dummy cells, in accordance with various embodiments. As shown, the layout 1300 includes an NW 1302 and a PW 1352. In the NW 1302, the layout 1300 includes: an active region 1304, a number of gate structures 1306, 1308, and 1310, and a number of MDs 1312, 1314, 1316, and 1318; and in the PW 1352, the layout 1300 includes: an active region 1354, a number of gate structures 1356, 1358, and 1360, and a number of MDs 1362, 1364, 1366, and 1368. The gate structure 13310 may be disposed closet to one of the edges of the NW 1302 than any other gate structures, and the gate structure 1360 may be disposed closet to one of the edges of the PW 1352 than any other gate structures.

In some embodiments, the gate structures 1306 and 1308 can collectively function as a gate of the PMOS 302 of a WL driver 1301 (which is coupled to the same control signal 303), with the MDs 1312 and 1316 coupled to VDD and the MD 1314 coupled to at least one corresponding WL. The gate structure 1210 can partially function as a gate of the PMOS 302 of a WL driver 1303 (which is tied to VSS), with the MDs 1316 and 1318 both tied to VDD. The gate structures 1356 and 1358 can function as gates of the NMOS 304 and NMOS 306 of the WL driver 1301 (which are coupled to the control signals 305 and 307, respectively), with the MDs 1362 and 1366 coupled to VDD and the MD 1364 coupled to at least one corresponding WL. The gate structure 1360 can partially function as a gate of any of the NMOS 304 and NMOS 306 of the WL driver 1303 (which are tied to VSS), with the MDs 1366 to 1368 all tied to VDD. As such, a half of WL driver 1303 may function as a dummy cell.

In one aspect of the present disclosure, a memory device is disclosed. The memory device includes a substrate. The memory device includes a memory array comprising a plurality of word lines (WLs), the plurality of WLs each extending along a first lateral direction. The memory device includes a plurality of WL drivers operatively coupled to the plurality of WLs, respectively. Each of the plurality of WL drivers comprises at least a first transistor having a first conductive type and a second transistor having a second conductive type opposite to the first conductive type. The plurality of WLs comprise a first subset of WLs that are disposed in different memory layers along a vertical direction and have respectively different lengths extending along the first lateral direction. The first transistors, operatively coupled to the first subset of WLs, are disposed in a first region of the substrate, and the second transistors, operatively coupled to the first subset of WLs, are disposed in a second region of the substrate. The first region and the second region are spaced apart from each other.

In another aspect of the present disclosure, a memory device is disclosed. The memory device includes a plurality of word lines (WLs). The memory device includes a plurality of drivers that are each configured to control a corresponding one of the plurality of WLs and each comprise a first transistor having a first conductive type and a second transistor having a second conductive type. The first transistor of a first one of the drivers is formed in a first well of a substrate, and the second transistor of the first driver is formed in a second well of the substrate. The first well is spaced apart from the second well.

In yet another aspect of the present disclosure, a method for fabricating a memory device is disclosed. The method includes forming a first transistor in a first region of a substrate, wherein the first transistor has a first conductive type. The method includes forming a second transistor in a second region of the substrate spaced apart from the first region, wherein the second transistor has a second conductive type opposite to the first conductive type. The method includes forming a memory array over the first and second transistors, wherein the memory array includes a plurality of word lines (WLs) each operatively coupled to a corresponding subset of memory cells of the memory array. The method includes coupling both the first transistor and second transistor to a first one of the plurality of WLs.

As used herein, the terms "about" and "approximately" generally mean plus or minus 10% of the stated value. For example, about 0.5 would include 0.45 and 0.55, about 10 would include 9 to 11, about 1000 would include 900 to 1100.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device, comprising:
    a plurality of word lines (WLs) above a substrate;
    a plurality of memory strings laterally isolated from each other, wherein each of the plurality of memory strings is operatively coupled to a respective subset of the plurality of WLs; and
    a plurality of drivers each configured to control a corresponding one of the plurality of WLs and comprising a first transistor having a first conductive type and a second transistor having a second conductive type opposite to the first conductive type.

2. The memory device of claim 1, wherein the first transistor of a first one of the drivers is formed in a first well of the substrate, and the second transistor of the first driver is formed in a second well of the substrate.

3. The memory device of claim 2, wherein the first well is spaced apart from the second well.

4. The memory device of claim 2, wherein the first well has the second conductive type and the second well has the first conductive type.

5. The memory device of claim 2, wherein the first transistor of a second one of the plurality of drivers is disposed immediately next to the first transistor of the first driver, and the second transistor of the second driver is disposed immediately next to the second transistor of the first driver, and wherein the WLs controlled by the first driver and the second driver, respectively, are disposed in a same memory layer.

6. The memory device of claim 5, wherein the first transistor of the second driver is also disposed in the first well, and the second transistor of the second driver is also disposed in the second well.

7. The memory device of claim 2, wherein the first transistor of a third one of the plurality of drivers is disposed immediately next to the first transistor of the first driver, and the second transistor of the third driver is disposed immediately next to the second transistor of the first driver, and wherein the WLs controlled by the first driver and third driver, respectively, are disposed in neighboring memory layers.

8. The memory device of claim 7, wherein the first transistor of the third driver is also disposed in the first well, and the second transistor of the third driver is also disposed in the second well.

9. The memory device of claim 1, wherein the plurality of drivers interposed between the plurality of WLs and the substrate.

10. The memory device of claim 2, wherein the subset of WLs are vertically spaced apart and electrically isolated from one another, and wherein the subset of the plurality of WLs form a staircase profile.

11. The memory device of claim 1, further comprising a plurality of memory strings laterally isolated from each other, wherein each of the plurality of memory strings is operatively coupled to a respective subset of the plurality of WLs.

12. A memory device, comprising:
    a memory array comprising a plurality of word lines (WLs) over a substrate, the plurality of WLs each extending along a first lateral direction; and
    a plurality of WL drivers operatively coupled to the plurality of WLs, respectively, wherein each of the plurality of WL drivers comprises at least a corresponding one of a plurality of first transistors having a first conductive type and a corresponding one of a plurality of second transistors having a second conductive type opposite to the first conductive type;
    wherein the plurality of WLs comprise a first subset of WLs that are disposed in different memory layers along a vertical direction and have respectively different lengths extending along the first lateral direction.

13. The memory device of claim 12, wherein the first transistors, operatively coupled to the first subset of WLs, are disposed in a first region of a substrate, and the second transistors, operatively coupled to the first subset of WLs, are disposed in a second region of the substrate; and wherein the first region and the second region are spaced apart from each other.

14. The memory device of claim 13, wherein the first region and the second region are positioned on opposite sides of the memory array along the first lateral direction.

15. The memory device of claim 13, wherein the first region is a first well having the second conductive type, and the second region is a second well having the first conductive type.

16. The memory device of claim 12, wherein the plurality of WL drivers are disposed between the substrate and the memory array.

17. The memory device of claim 12, wherein the plurality of WLs comprise a second subset of WLs that are disposed in a same memory layer along the vertical direction and have a same length extending along the first lateral direction.

18. A method of forming a memory device, comprising:
forming a first transistor in a first region of a substrate, wherein the first transistor has a first conductive type;
forming a second transistor in a second region of the substrate spaced apart from the first region, wherein the second transistor has a second conductive type opposite to the first conductive type;
forming a memory array over the first and second transistors, wherein the memory array includes a plurality of word lines (WLs) each operatively coupled to a corresponding subset of memory cells of the memory array;
coupling both the first transistor and second transistor to a first one of the plurality of WLs;
forming a third transistor in the first region immediately next to the first transistor, wherein the third transistor has the first conductive type;
forming a fourth transistor in the second region immediately next to the second transistor, wherein the fourth transistor has the second conductive type; and
coupling both the third transistor and fourth transistor to a second one of the plurality of WLs.

19. The method of claim 18, wherein the first WL and second WL are disposed in a same memory layer.

20. The method of claim 19, further comprising:
forming a plurality of drivers, wherein each of the plurality of drivers is configured to control a corresponding one of the plurality of WLs and each comprise a first transistor having a first conductive type and a second transistor having a second conductive type.

* * * * *